US012589991B2

(12) United States Patent
Huang

(10) Patent No.: US 12,589,991 B2
(45) Date of Patent: Mar. 31, 2026

(54) LOCKING MECHANISMS FOR PRECISION OFFSET/DEPLOYMENT OF MEMS STRUCTURES

(71) Applicant: OMNITRON SENSORS INC., Los Angeles, CA (US)

(72) Inventor: Trent Huang, Los Angeles, CA (US)

(73) Assignee: OMNITRON SENSORS INC., Los Angeles, CA (US)

( * ) Notice: Subject to any disclaimer, the term of this patent is extended or adjusted under 35 U.S.C. 154(b) by 356 days.

(21) Appl. No.: 18/328,624

(22) Filed: Jun. 2, 2023

(65) Prior Publication Data

US 2024/0327200 A1     Oct. 3, 2024

Related U.S. Application Data

(60) Provisional application No. 63/492,946, filed on Mar. 29, 2023.

(51) Int. Cl.
*G02B 26/08* (2006.01)
*B81B 3/00* (2006.01)
*B81C 1/00* (2006.01)

(52) U.S. Cl.
CPC ........ *B81C 1/00301* (2013.01); *B81B 3/0054* (2013.01); *G02B 26/0833* (2013.01); *B81B 2201/042* (2013.01); *B81C 2201/0133* (2013.01)

(58) Field of Classification Search
CPC ........ B81C 1/00301; B81C 2201/0133; B81B 3/0054; B81B 2201/042; G02B 26/0833; G02B 26/0841
See application file for complete search history.

(56) References Cited

U.S. PATENT DOCUMENTS

| | | | |
|---|---|---|---|
| 6,600,850 B1 | 7/2003 | Fan | |
| 2002/0170290 A1* | 11/2002 | Bright | ................ G02B 26/0841 |
| | | | 60/527 |
| 2002/0180311 A1 | 12/2002 | Yeh | |
| 2003/0049879 A1* | 3/2003 | Lin | ..................... G02B 6/3518 |
| | | | 216/2 |
| 2009/0122383 A1 | 5/2009 | Reyes | |

OTHER PUBLICATIONS

International Search Report and Written Opinion issued in PCT/US2024/022215 on Jul. 12, 2024 (13 pages).

* cited by examiner

*Primary Examiner* — Euncha P Cherry

(74) *Attorney, Agent, or Firm* — NIXON PEABODY LLP

(57) ABSTRACT

A system and method for precisely positioning a moveable structure in a micro-electromechanical system (MEMS). The system includes a substrate and a moveable device structure supported on the substrate. The device structure is moveable from an initial position to a deployment position at a predetermined offset angle to the substrate. A moveable anchor structure is supported on the substrate in proximity to the device structure. The anchor structure is locked to the device structure when the device structure is moved to the deployment position.

18 Claims, 15 Drawing Sheets

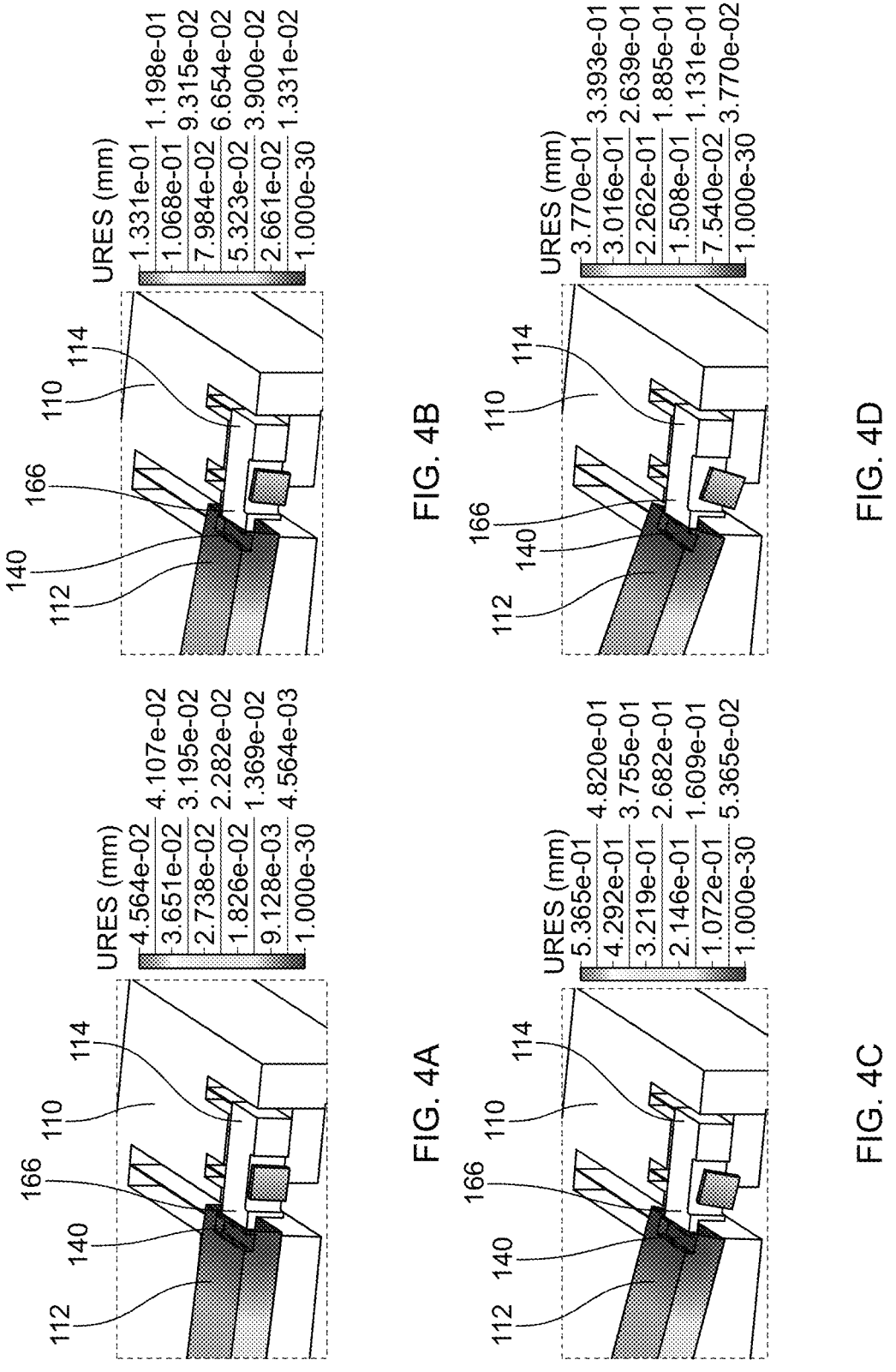

URES (mm)
2.477e-01　2.229e-01
1.901e-01　1.734e-01
1.486e-01　1.238e-01
9.906e-02　7.430e-02
4.953e-02　2.477e-02
1.000e-30

URES (mm)
3.770e-01　3.393e-01
3.016e-01　2.639e-01
2.262e-01　1.885e-01
1.508e-01　1.131e-01
7.540e-02　3.770e-02
1.000e-30

URES (mm)
5.365e-01　4.820e-01
4.292e-01　3.755e-01
3.219e-01　2.682e-01
2.146e-01　1.609e-01
1.072e-01　5.365e-02
1.000e-30

URES (mm)
7.522e-01　6.770e-01
6.018e-01　5.266e-01
4.513e-01　3.761e-01
3.002e-01　2.257e-01
1.504e-01　7.522e-02
1.000e-30

URES (mm)
9.002e-01
8.102e-01
7.202e-01
6.302e-01
5.401e-01
4.501e-01
3.601e-01
2.701e-01
1.800e-01
9.002e-02
1.000e-30

URES (mm)
9.002e-01
8.102e-01
7.202e-01
6.302e-01
5.401e-01
4.501e-01
3.601e-01
2.701e-01
1.800e-01
9.002e-02
1.000e-30

900

1000

LOCKING MECHANISMS FOR PRECISION OFFSET/DEPLOYMENT OF MEMS STRUCTURES

PRIORITY CLAIM

The present disclosure claims benefit of and priority to U.S. Provisional Ser. No. 63/492,946, filed Mar. 29, 2023. The contents of that application are hereby incorporated by reference in their entirety.

TECHNICAL FIELD

The present disclosure relates generally to alignment of MEMS structures. More particularly, aspects of this disclosure relate to a precision anchoring system that allows MEMS structures to be deployed and locked at a predetermined orientation.

BACKGROUND

Micro-electromechanical systems (MEMS) are microscopic devices incorporating both electronic devices and physical moving parts. A typical MEMS device is fabricated using integrated circuit techniques on a silicon wafer or wafers. The fabrication process creates the physical moving parts from fabricating different materials that may be deposited and etched on the substrate wafer.

MEMS have numerous applications such as in microphones, sensors, accelerometers, and light detection and ranging (LIDAR) systems. MEMS fabrication is intrinsically two dimensional to create physical structures on a substrate. Custom offsets of such structures add another dimension to MEMS topology and functionality. However, offsetting structures is often defined/limited by the dimensions of external tools and/or assembly accuracy from the fabrication process. Thus, orientation adjustment of offsetting structures may only be accomplished by changing the parameters of the fabrication process, which is an expensive and time consuming proposition.

Thus, there is a need for a device structure that allows a MEMS structure to be deployed at a precise angle on a substrate. There is a further need for a device structure that allows the deployment angle of a MEMs structure to be easily controlled. There is a further need for a versatile basic positioning structure to allow multiple MEMS structures to be deployed at precision angles.

SUMMARY

The term embodiment and like terms are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter; nor is it intended to be used in isolation to determine the scope of the claimed subject matter. The subject matter should be understood by reference to appropriate portions of the entire specification of this disclosure, any or all drawings and each claim.

One disclosed example is a micro-electromechanical system (MEMS) including a substrate and a moveable device structure supported on the substrate. The device structure is moveable from an initial position to a deployment position at a predetermined offset angle to the substrate. A moveable anchor structure is supported on the substrate in proximity to the device structure. The anchor structure is locked to the device structure when the device structure is moved to the deployment position.

In another disclosed implementation of the example system, the system includes an adhesive joining the device structure to the anchor structure in the locked position. In another disclosed implementation, the system further includes a first spring member coupled to the moveable anchor structure. The anchor structure deforms the first spring member from the movement of the device structure. In another disclosed implementation, the predetermined offset angle is determined by a dimension of the device structure. In another disclosed implementation, the anchor structure includes a tab mating to a locking slot of the device structure. In another disclosed implementation, the system includes a second anchor structure supported on the substrate. The second anchor structure is coupled to a second spring member. The device structure contacts the second anchor structure in the deployment position. In another disclosed implementation, the system includes a torsional bar coupling the device structure to the substrate. In another disclosed implementation, the system includes a bending beam coupling the device structure to the substrate. In another disclosed implementation, the device structure includes a mirror. In another disclosed implementation, the predetermined offset angle is based on force balances between predetermined translational and rotational stiffnesses of the first spring member. In another disclosed implementation, a one-dimensional actuator is used to position the first moveable structure into the deployment position. In another disclosed implementation, the moveable device structure is part of a light detection and ranging (LiDAR) beam steering apparatus. In another disclosed implementation, the moveable device structure includes an actuation pad overlapping a cutout in the anchor structure. Force applied to the actuation pad causes the moveable device structure to move to the deployed position. In another disclosed implementation, the moveable device structure is fabricated from at least one of crystalline, polycrystalline, or metal materials.

Another disclosed example is a method of fixing a moveable structure at a predetermined angle in a micro-electromechanical system (MEMS). A moveable device structure torsionally supported on a substrate is formed in an initial position. A moveable anchor structure supported by the substrate is formed in proximity to the device structure. The device structure is moved from an initial position to a deployment position at a predetermined offset angle to the substrate. The anchor structure is locked to the device structure when the device structure is moved to the deployment position.

In another disclosed implementation of the example method, an adhesive is applied joining the device structure to the anchor structure in the locked position. In another disclosed implementation, the first spring member is coupled to the moveable anchor structure. The anchor structure deforms the first spring member from the movement of the device structure. In another disclosed implementation, the anchor structure includes a tab mating to a locking slot of the device structure. In another disclosed implementation, a one-dimensional actuator is used to position the first moveable structure into the deployment position. In another disclosed implementation, the moveable device structure includes an actuation pad overlapping a cutout in the anchor structure. Force is applied to the actuation pad causing the moveable device structure to move to the deployed position.

BRIEF DESCRIPTION OF THE DRAWINGS

The disclosure will be better understood from the following description of exemplary embodiments together with reference to the accompanying drawings, in which.

4

Figure 10A:
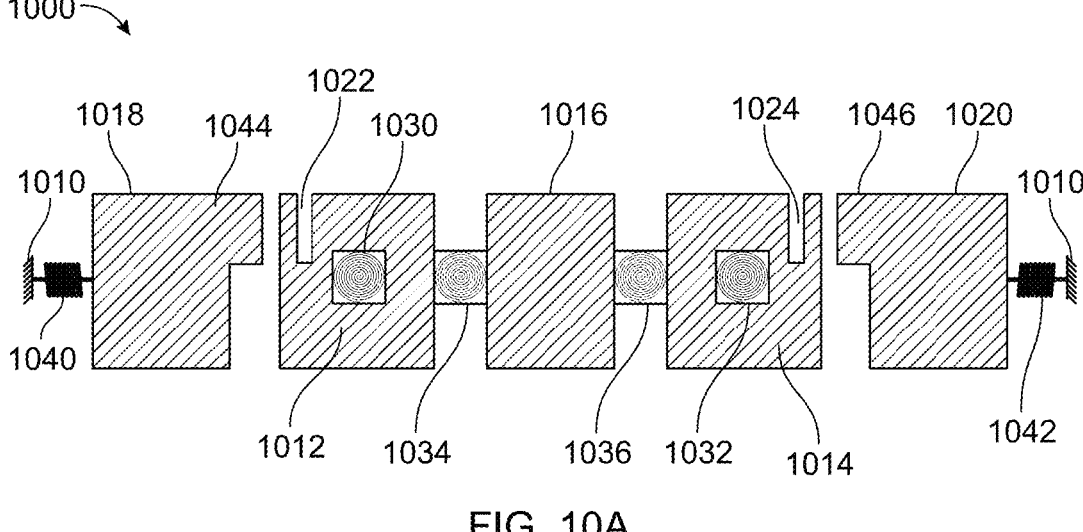
FIG. 10A is a side mechanical view of another anchoring arrangement for dual moveable structures for a MEMS device in an initial position.
Figure 10B:
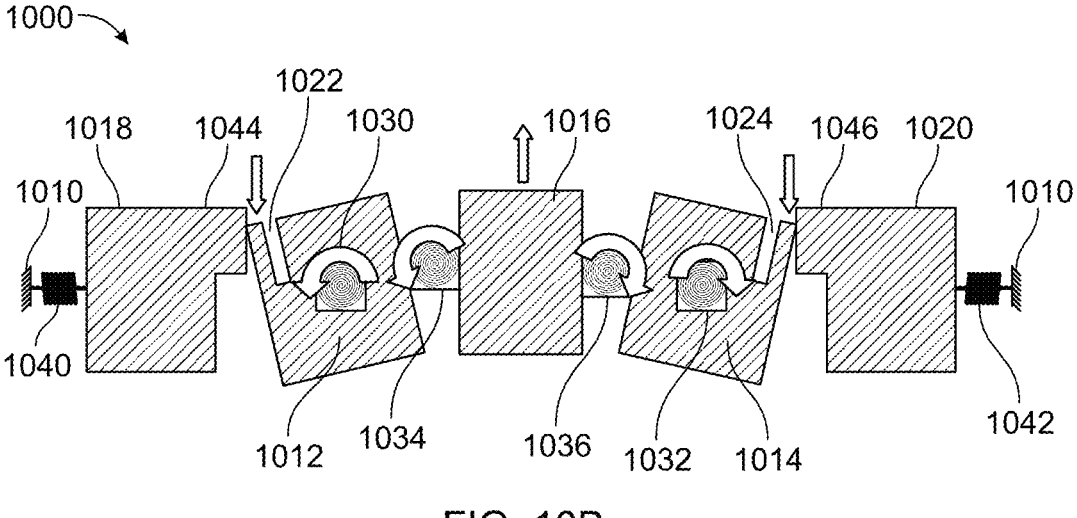
FIG. 10B is a side mechanical view of another anchoring arrangement for dual moveable structures for a MEMS device being deployed.
Figure 10C:
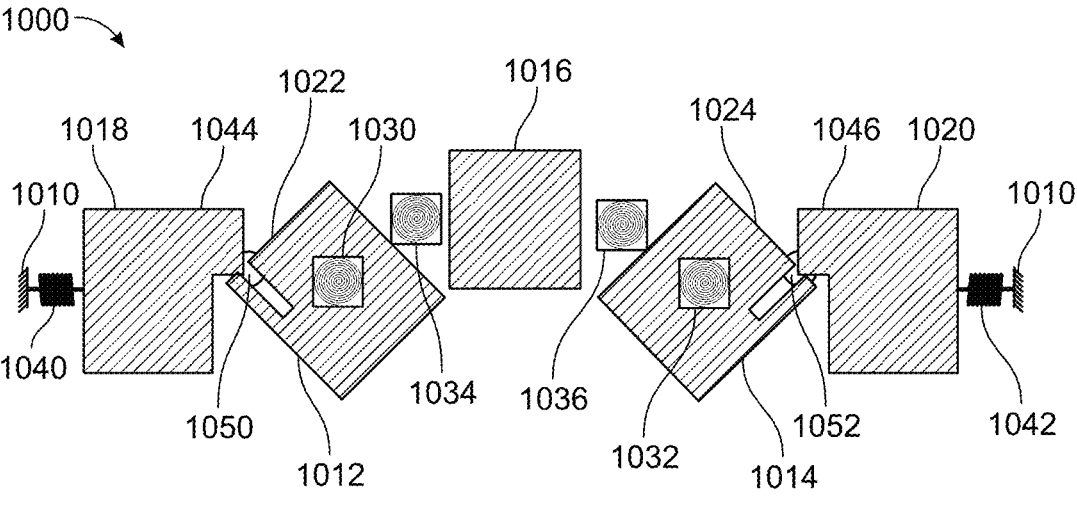
Figure 11:
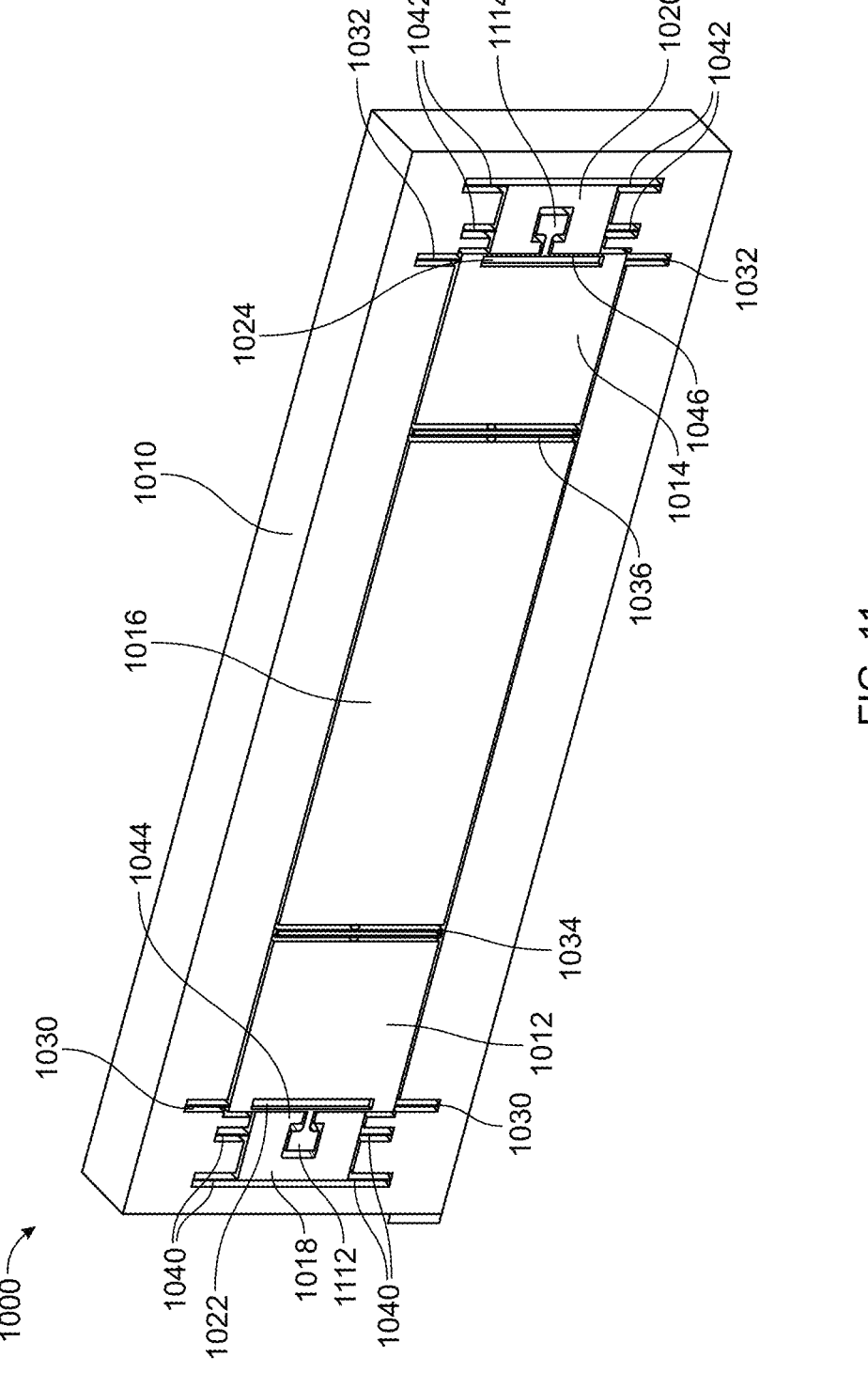

FIG. 10C is a side mechanical view of another anchoring arrangement for dual moveable structures for a MEMS device in a deployed position; and FIG. 11 is a perspective view of the anchoring arrangement in FIG. 10A fabricated on a substrate.

The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION OF THE ILLUSTRATED EMBODIMENTS

The present inventions can be embodied in many different forms. Representative embodiments are shown in the drawings, and will herein be described in detail. The present disclosure is an example or illustration of the principles of the present disclosure, and is not intended to limit the broad aspects of the disclosure to the embodiments illustrated. To that extent, elements and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

The present disclosure is directed toward a MEMS device that includes offset structures that are deployed against an anchor structure to insure deployment at a pre-determined angle. The present disclosure features spring-loaded structures locking with adjacent on chip structures (fixed or spring-loaded) to allow for a deterministic offset of the structure. The specific offset angle is pre-determined by design, therefore minimizing loss of structural precision due to variations in assembly process. The example process allows for the precision fabricated gaps on both the top and the bottom of the structure, therefore enabling multiple locking mechanisms suited for different types of offsets.

Figure 1A:
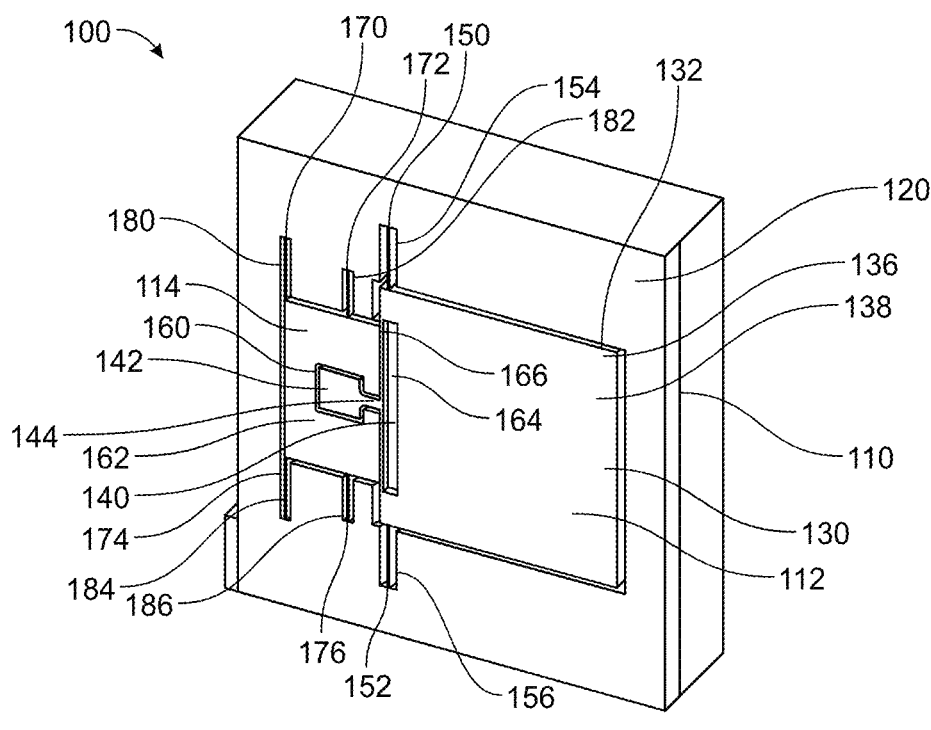
FIG. 1A is a front perspective view of an example MEMS device with a moveable structure and an anchor structure.
Figure 1B:
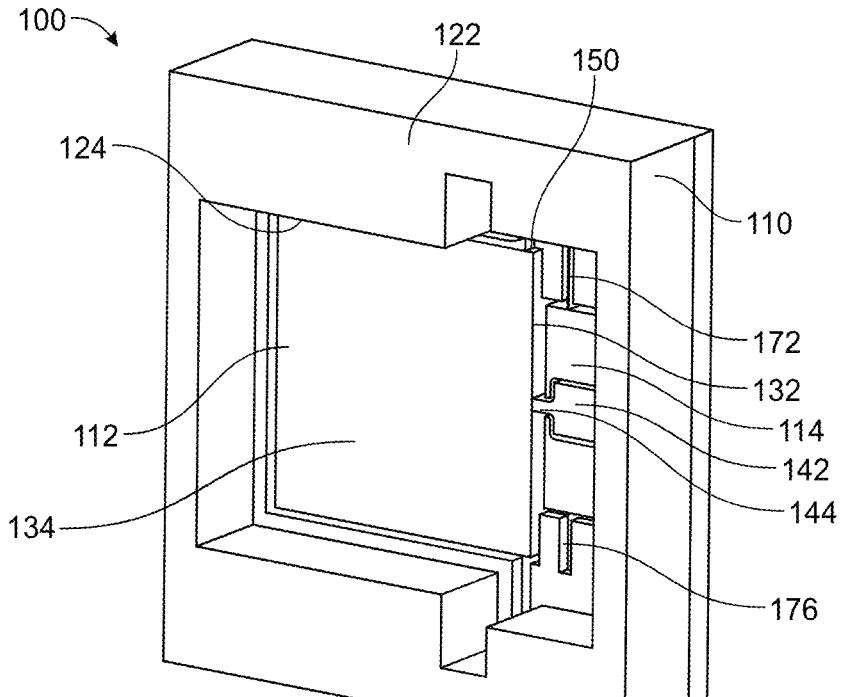
FIG. 1B is a back perspective view of an example MEMS device with the moveable structure and anchor structure.
Figure 2:
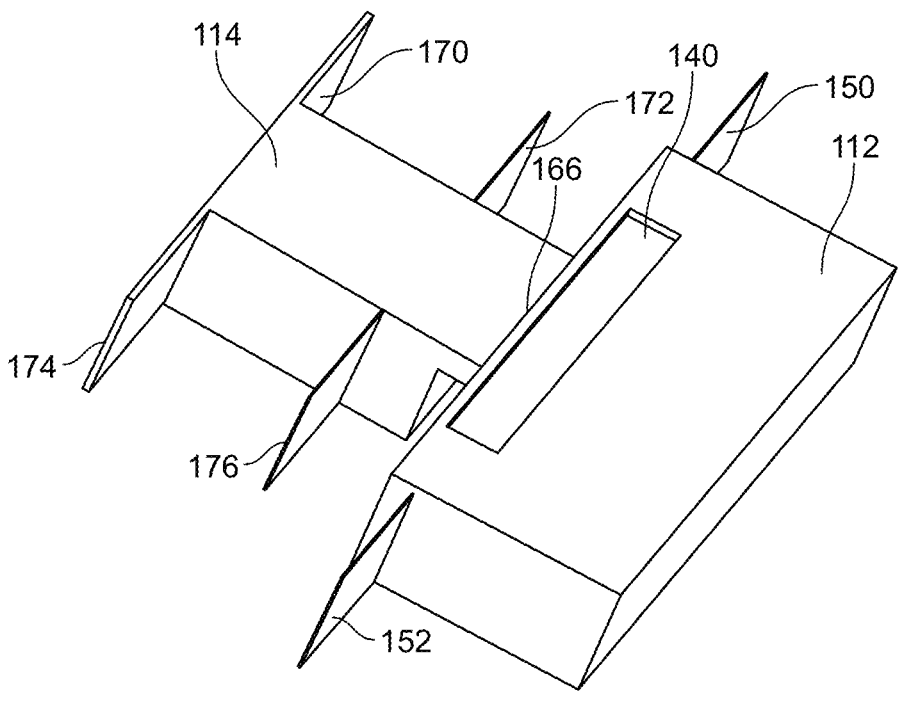
FIG. 2 is an isolated perspective view of the moveable structure and anchor structure in FIGS. 1A-1B.

FIG. 1A is a front perspective view of an example micro-electromechanical system (MEMS) device 100. FIG. 1B is a back perspective view of the example MEMS device 100. The MEMS device 100 includes an anchor substrate 110. A moveable device structure 112 is supported on the substrate 110. A moveable anchor structure 114 is supported on the anchor substrate 110 in proximity to the device structure 112. FIG. 2 is an isolated perspective view of the moveable structure 112 and the anchor structure 114.

In this example, the anchor substrate 110, device structure 112, and anchor structure 114 are manufactured from materials that may be microfabricated. In this example, the substrate is formed from a silicon wafer and the structures are formed from the silicon and polycrystalline materials such as polysilicon with various deposited metals. Thus, the structures herein may be formed from single crystal materials (e.g., Si, GaAs, InP); polycrystalline materials such as polysilicon, metals such as electroplated Ni, Cu, Au, and polymers, such as polyimides, epoxies (e.g., SU8), and PMGI. The anchor substrate 110 has a top surface 120 and an opposite bottom surface 122 with a cavity 124. The cavity 124, in conjunction with trenches cut around the device structure 112 and anchor structure 114 in the substrate 110 allows movement of the device structure 112 and the anchor structure 114 relative to the anchor substrate 110.

The device structure 112 includes a main component 130 that is separated via a trench 132 from the anchor substrate 110. The main component 130 has a bottom surface 134 and an opposite top surface 136. In this example, the device structure 112 is a mirror having a reflective layer 138 that may be coated with reflective metal formed on the top surface 136. The top surface 136 also includes a lateral slot 140. The main component 130 is joined to a relatively smaller actuation pad 142 that is positioned within the anchor structure 114. The actuation pad 142 is connected to the main component 130 via a connector 144. As will be explained, the device structure 112 is a mirror that is deployed at an offset angle that may be used in optical applications such as light detection and ranging (LiDAR). In this example the mirror on the moveable device structure 112 is part of a beam steering apparatus formed as part of the anchor substrate 110.

The main component 130 of the moveable device structure 112 is attached to the anchor substrate 110 via two torsion structures 150 and 152. The torsion structures 150 and 152 are centered in slots 154 and 156 formed in the anchor substrate 110. The torsion structures 150 and 152 act as torsion springs to allow the device structure 112 to be rotated on an axis parallel to the torsion structures 150 and 152. For example, a pick device may rotate the device structure 112 by applying force to the actuation pad 142. In this example, the device structure 112 is moveable from an initial position shown in FIG. 1B to a deployment position at a predetermined offset angle to the top surface 120 of the anchor substrate 110. In this example, the torsion structures 150 and 152 are torsional bars that couple the device structure 112 to the substrate 110. Alternatively other structures may be used to allow movement of the device structure 112. For example, a bending beam may couple the device structure 112 to the substrate 110 to allow for greater freedom of movement.

The anchor structure 114 includes a center cutout 160 formed on a top surface 162 that surrounds the actuation pad 142 of the moveable device structure 112. A proximal side 164 includes an extended tab structure 166. The anchor structure 114 is positioned within a cutout 168 that is formed between the top surface 120 of the anchor substrate 110 and the cavity 124. The anchor structure 114 includes opposite sides that each support a respective pair of in plane flexure members 170, 172, 174, and 176. Each of the flexure members 170, 172, 174, and 176 are connected to the anchor substrate 110 at the ends of respective slots 180, 182, 184, and 186. The flexure members 170, 172, 174, and 176 allow the movement of the anchor structure 114 in a motion away from the device structure 112. As will be explained, when the device structure 112 is rotated by force applied to the actuation pad 142, the anchor structure 114 is moved by the motion of the device structure 112. When the device structure 112 is moved to a desired angle at a deployment position, the anchor structure 114 is locked to the device structure 112 by the raised tab structure 166 being inserted in the lateral slot 140. This causes the device structure 112 to be locked into the desired predetermined offset angle to the substrate 110.

Figure 3:
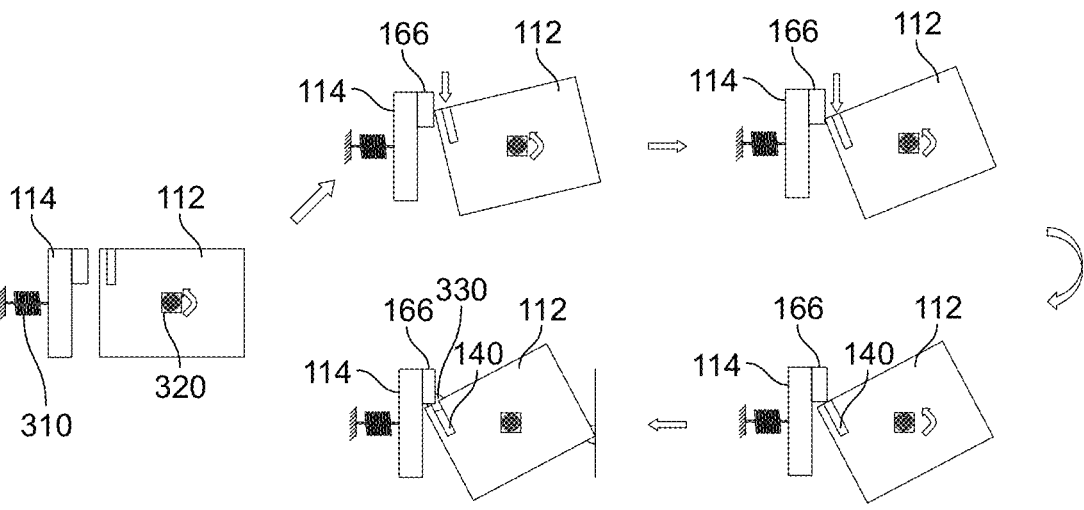
FIG. 3 is a mechanical diagram of the moveable structure and anchor structure that allows the moveable structure to be deployed.
Figures 4E, 4F, 4G, 4H:
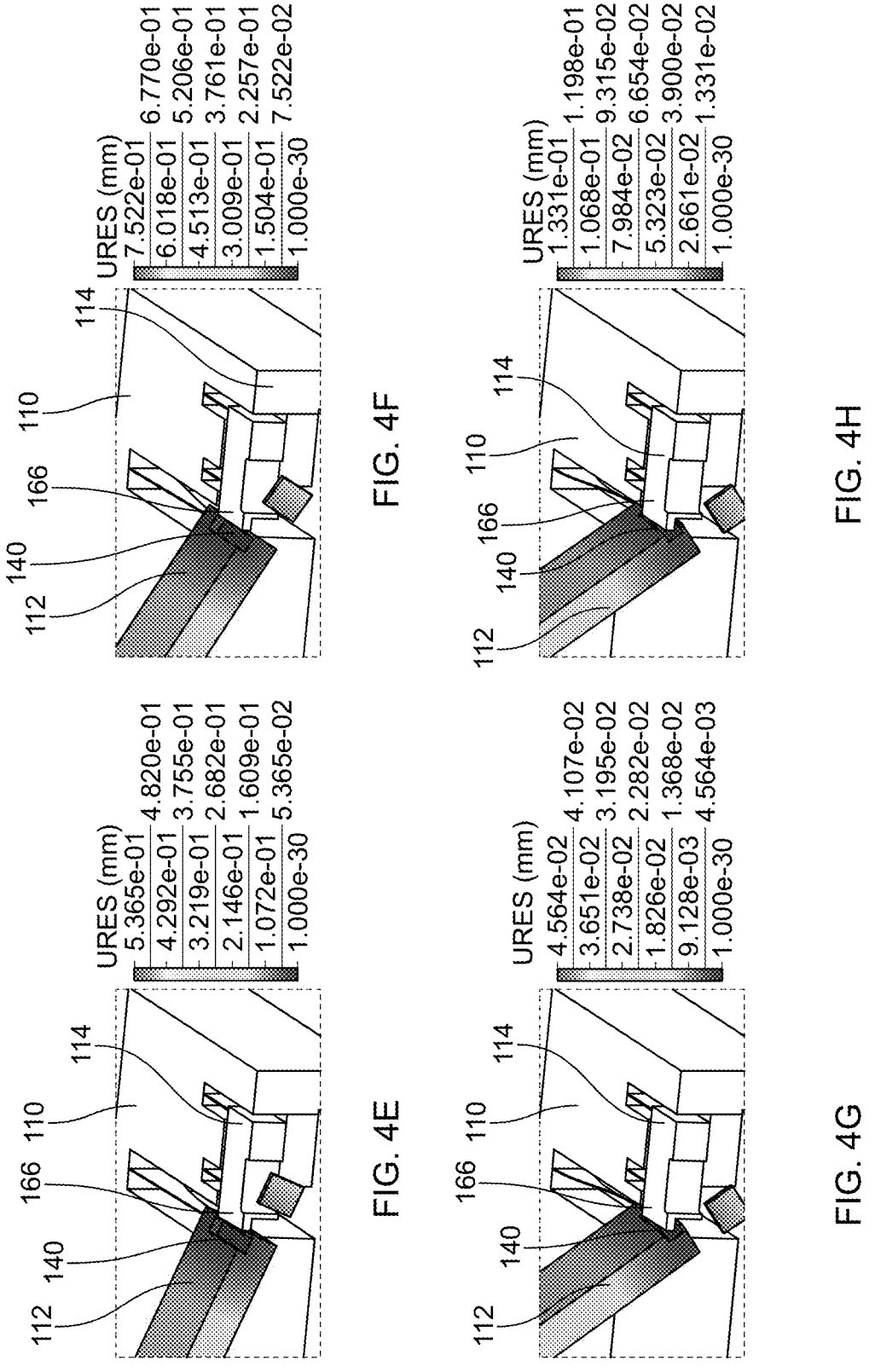
FIGS. 4A-4N are perspective views of the moveable structure and anchor structure in FIGS. 1A-1B when the moveable structure is deployed at the preset angle and locked in place.
Figures 4I, 4J, 4K, 4L:
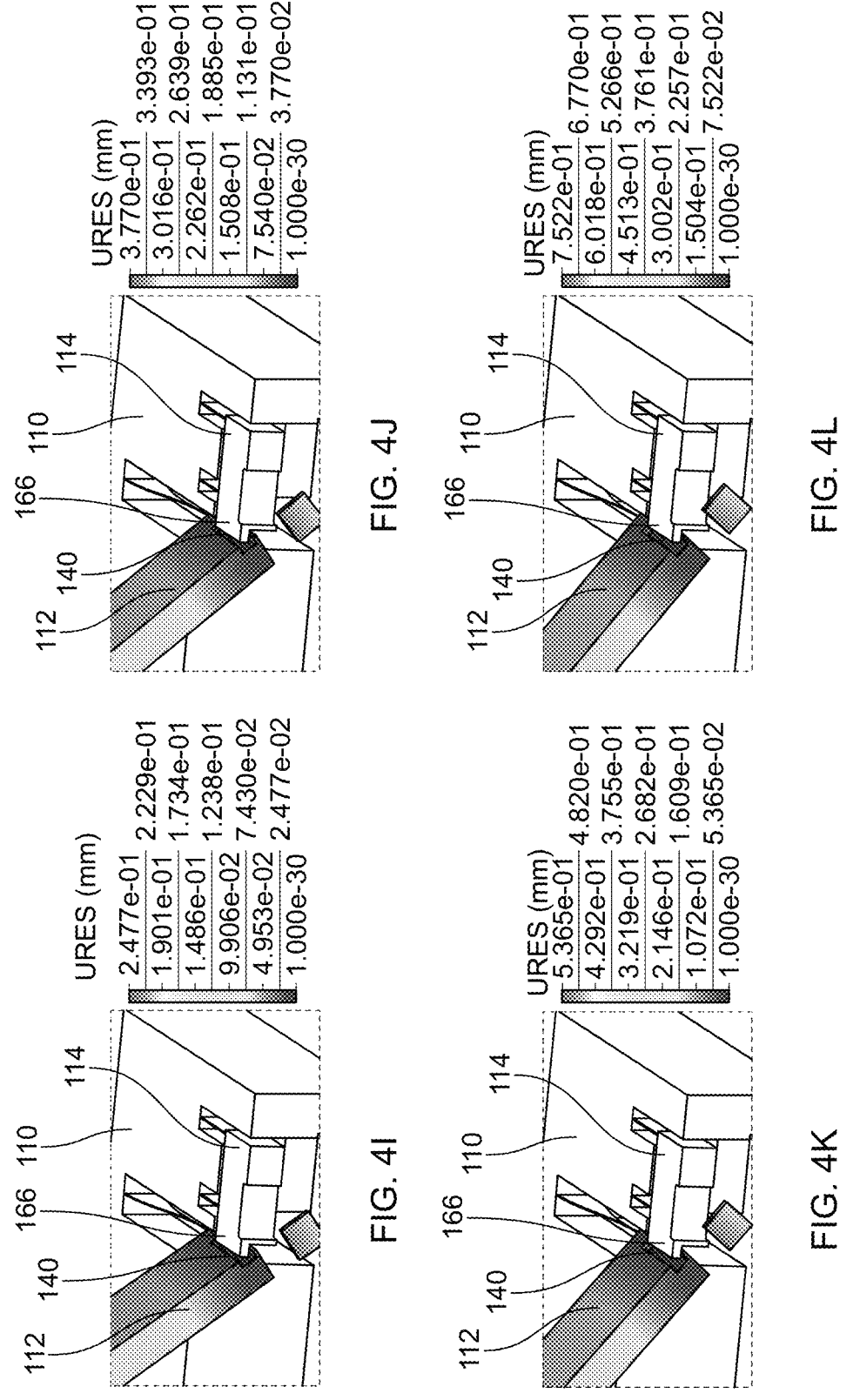
Figures 4M, 4N:
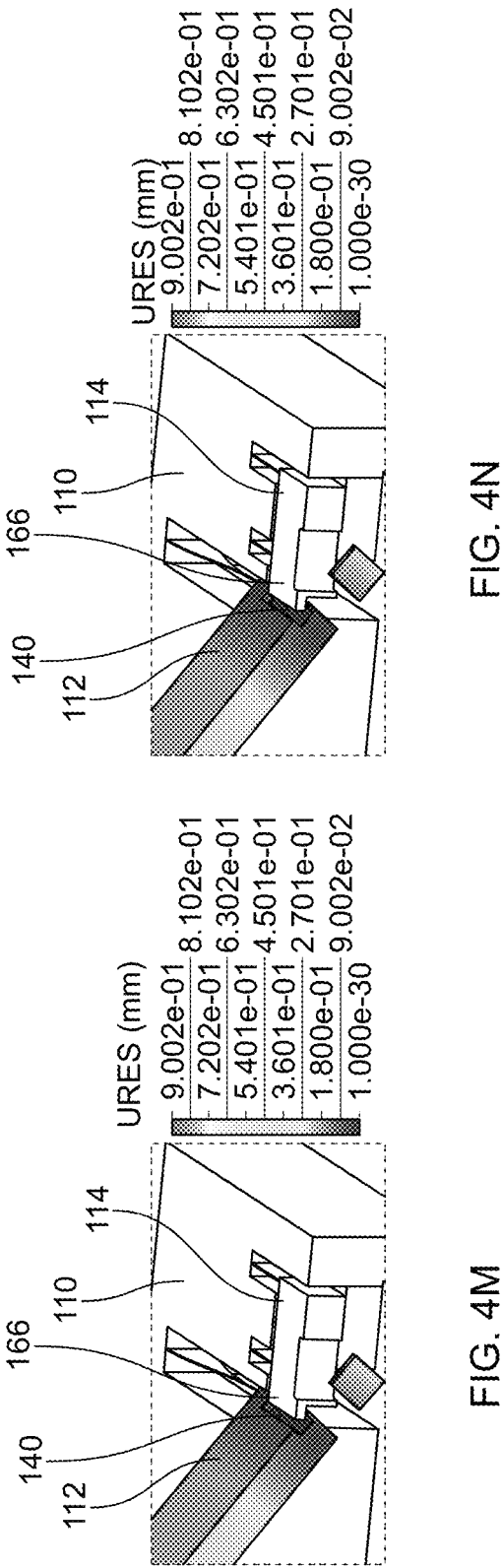

FIG. 3 shows a side view of the process of moving the device structure 112 into the deployment position with blocks representing the components shown in FIGS. 1A-1B. FIG. 4A-4N is a sequence of perspective views of the moveable structure 112 in the process of being locked at a precision offset to the anchor structure 114. FIG. 3 and FIGS. 4A-4N show the process of positioning the device structure 112 from an initial position to be locked into a deployment position. In this example, the device structure 112 may be a mirror that must be angled at a preset angle for operation of the MEMS device. FIG. 3 shows the device structure 112 in an initial position relative to the anchor structure 114 after fabrication is complete. FIG. 4A shows a perspective view of the positions of the device structure 112 and the anchor structure 114 on the substrate 110 in the initial position. The flexure members 170, 172, 174, and 176 are represented by a spring 310 in FIG. 3. An axis 320 represents the axis created by the torsion structures 150 and 152 in FIGS. 1A-1B.

A one-dimensional actuator is used to position the moveable device structure 112 into the deployment position. In this example, the one-dimensional actuator such as the pick and place machine contacts the actuation pad 142 in FIG. 1A and thus rotates the moveable device structure 112. As shown in the second position, the device structure 112 is initially rotated along the torsional axis 320. As the device structure 112 is rotated, the device structure 112 contacts an edge of the anchor structure 114. The contact from the device structure 112 puts force on the anchor structure 114. The anchor structure 114 may move as the spring structures 170, 172, 174, and 176 may be compressed as represented by the compression of the spring 310. Thus, the movement of the anchor structure 114 deforms the spring structures 170, 172, 174, and 176. The movement of the anchor structure 114 allows the leading edge of the device structure 112 to rotate to a position under the extended tab 166. As shown in the fourth position in FIG. 3 and FIGS. 4G-4N, once the leading edge of the device structure 112 is fully under the extended tab 166, the spring force from the spring 310 forces the anchor structure 114 back toward the device structure 112. The extended tab 166 then locks into the lateral slot 140.

When the extended tab 166 locks into the lateral slot 140, the device structure 112 is positioned at the desired angle. An adhesive 330 is then applied to join the slot 140 of the device structure 112 to the extended tab 166 of the anchor structure 114 in the locked position as shown in FIG. 3 and FIG. 4N.

Figures 5A, 5B:
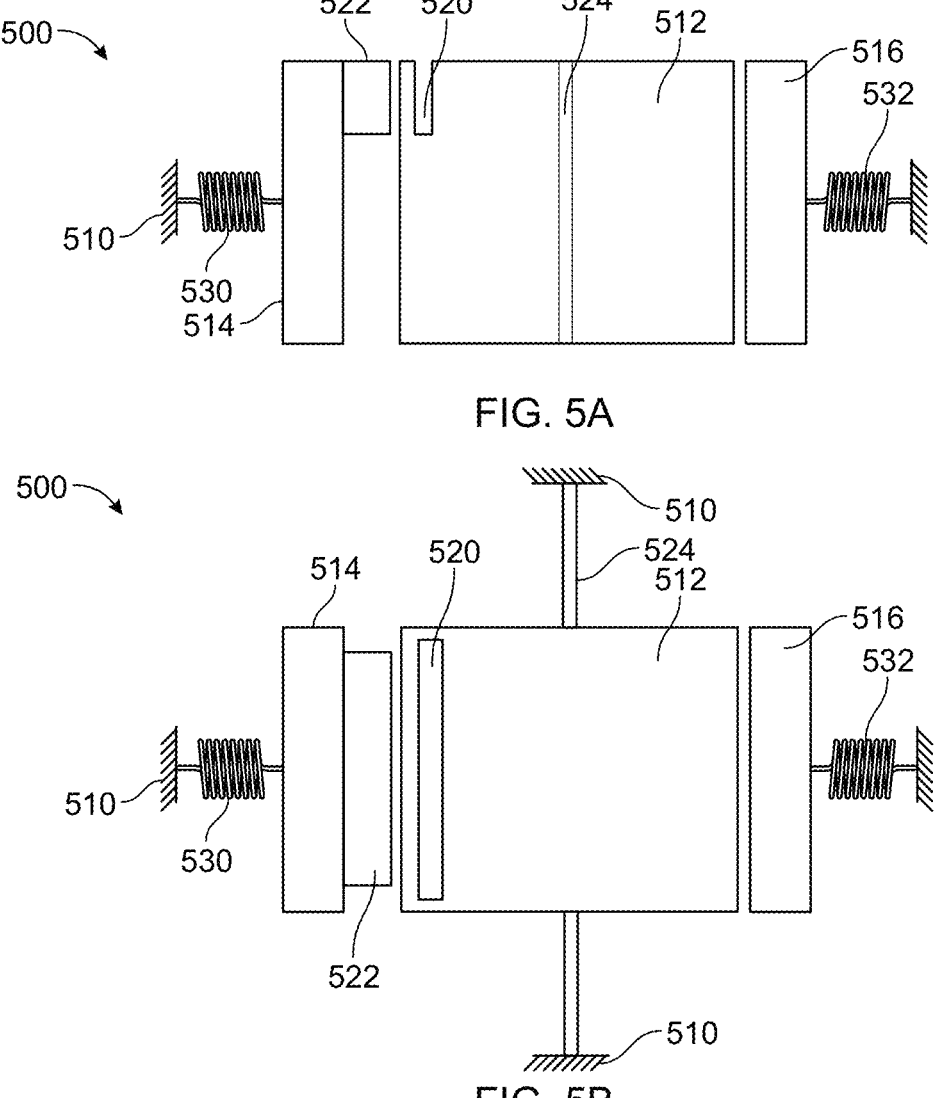
FIG. 5A is a side view mechanical diagram of another example moveable structure and two anchor structure.
FIG. 5B is a top view mechanical diagram of the moveable structure in FIG. 5A.

FIG. 5A shows a side view mechanical diagram of another arrangement 500 on a MEMs substrate 510 that includes moveable device structure 512 and two anchor structures 514 and 516. FIG. 5B shows a top view mechanical diagram of the arrangement. The moveable device structure 512 includes a slot 520 that locks in a tab 522 of the first anchor structure 514. The moveable device structure 512 is supported by torsional member 524 that allows rotation of the moveable device structure 512. The first anchor structure 514 is attached to the substrate 510 via spring flexure members represented by a spring 530. The second anchor structure 516 is supported on the substrate 510 via spring flexure members represented by a spring 532.

Figures 5C, 6A, 6B:
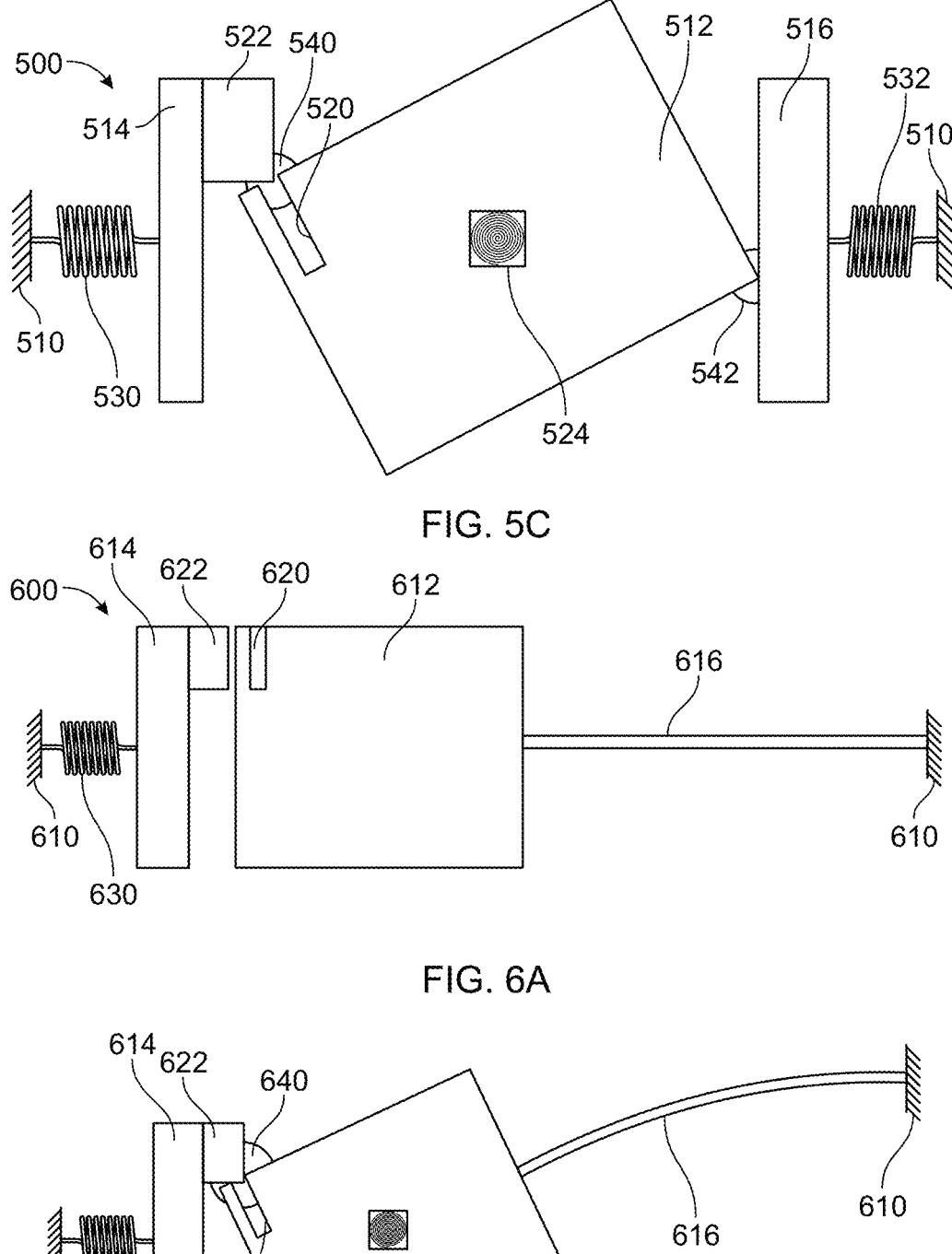
FIG. 5C is a side view mechanical diagram of the example moveable structure and two anchor structure in FIG. 5A in a deployed position.
FIG. 6A is a side view mechanical diagram of another example moveable structure supported by a beam.
FIG. 6B is a side view mechanical diagram of the example moveable structure in FIG. 6A in a deployed position.

FIG. 5C shows the moveable device structure 512 in the deployed position. The moveable device structure 512 is rotated around the torsional members 524. When the moveable structure 512 is rotated, opposite edges contact both the anchor structures 514 and 516. The contact pushes the anchor structures 514 and 516 toward the substrate 510 and compresses the springs 530 and 532. In the deployed position, the moveable structure 512 has been locked into place by the edge tab 522 of the anchor structure 514 being inserted in the slot 520. The first anchor structure 514 thus holds the moveable device structure 512 at the desired angle. The moveable structure 512 also abuts the second anchor structure 516 that provides further support for the moveable device structure 512. An adhesive 540 is applied between the tab 522 and the slot 520. Another adhesive 542 is applied where the edge of the moveable structure 512 contacts the anchor 516.

FIG. 6A shows a side view mechanical diagram of another example arrangement 600 of a moveable device structure 612 supported by a MEMS substrate 610. FIG. 6B shows a side view mechanical diagram of the moveable device 612 being moved into a deployment position. In this example, the moveable device 612 is supported by a flexible beam 616 attached to the substrate 610. Unlike the torsion bar arrangement in FIGS. 1A-1B, the flexible beam 616 allows the moveable device structure 612 to be moved in different dimensions. The moveable device structure 612 includes a slot 620 that locks in a tab 622 of the anchor structure 614. The anchor structure 614 is attached to the substrate 610 via spring flexure members represented by a spring 630.

The moveable device structure 612 may be moved to deform the beam structure 616. When the moveable structure 612 is moved, edges contact the anchor structure 614. The contact pushes the anchor structure 614 toward the substrate 610 and compresses the spring 630. In the deployed position, the moveable structure 612 has been locked into place by the edge tab 622 of the anchor structure 614 being inserted in the slot 620. The anchor structure 614 thus holds the moveable device structure 612 at the desired angle. An adhesive 640 is applied between the tab 622 and the slot 620.

The predetermined offset angle of the device structure 112 may be determined by different dimensions of the device structure 112 and or the anchor structure 114. The predetermined offset angle is also based on balances of forces between predetermined translational and rotational stiffnesses of the spring members supporting the anchor structure 114.

Figures 7A, 7B:
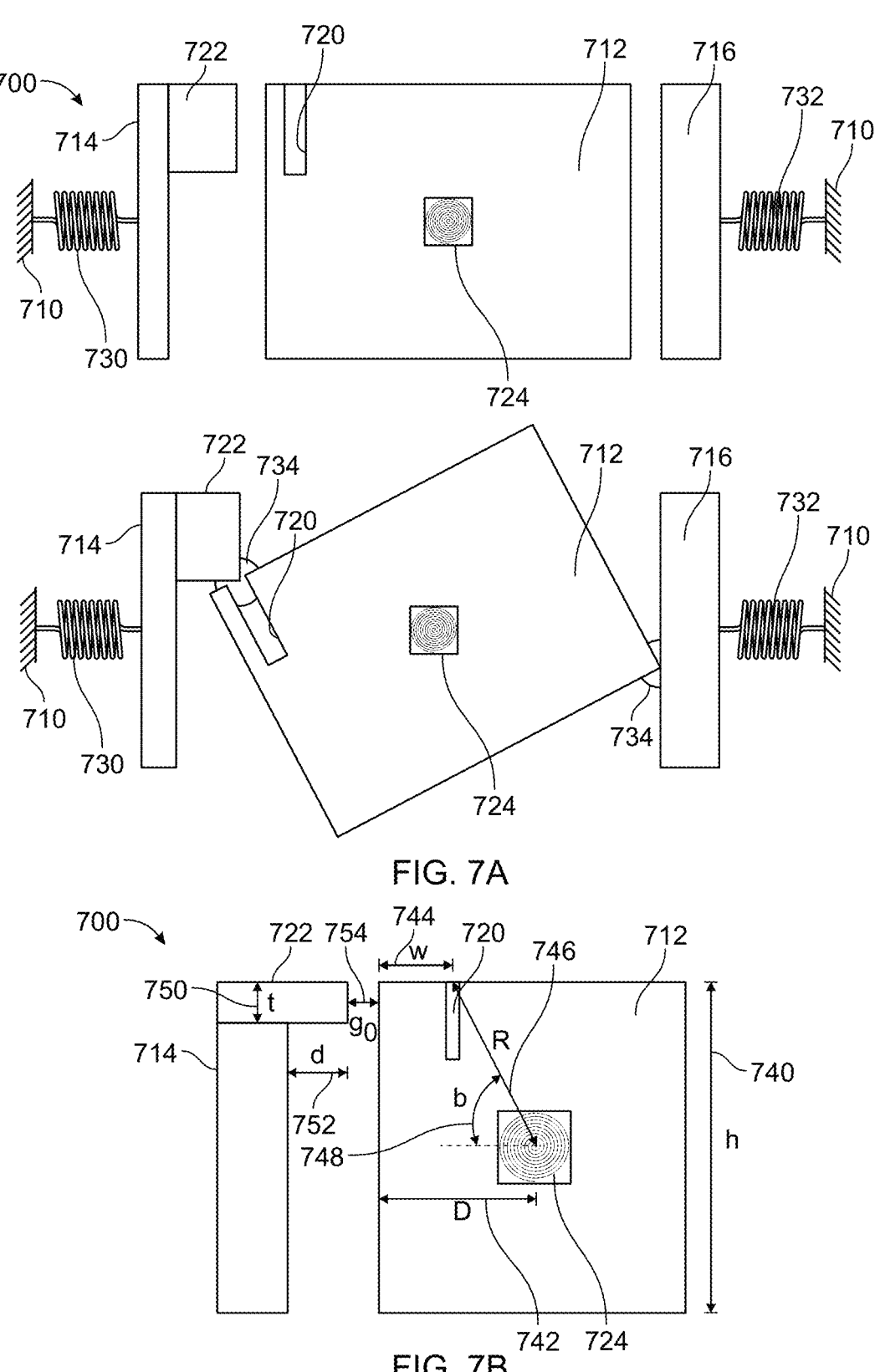
FIG. 7A is an example moveable structure that is designed to be deployed at a predetermined angle.
FIG. 7B shows example dimensions to determine the predetermined angle of the example moveable structure in FIG. 7A.
Figures 7C, 7D:
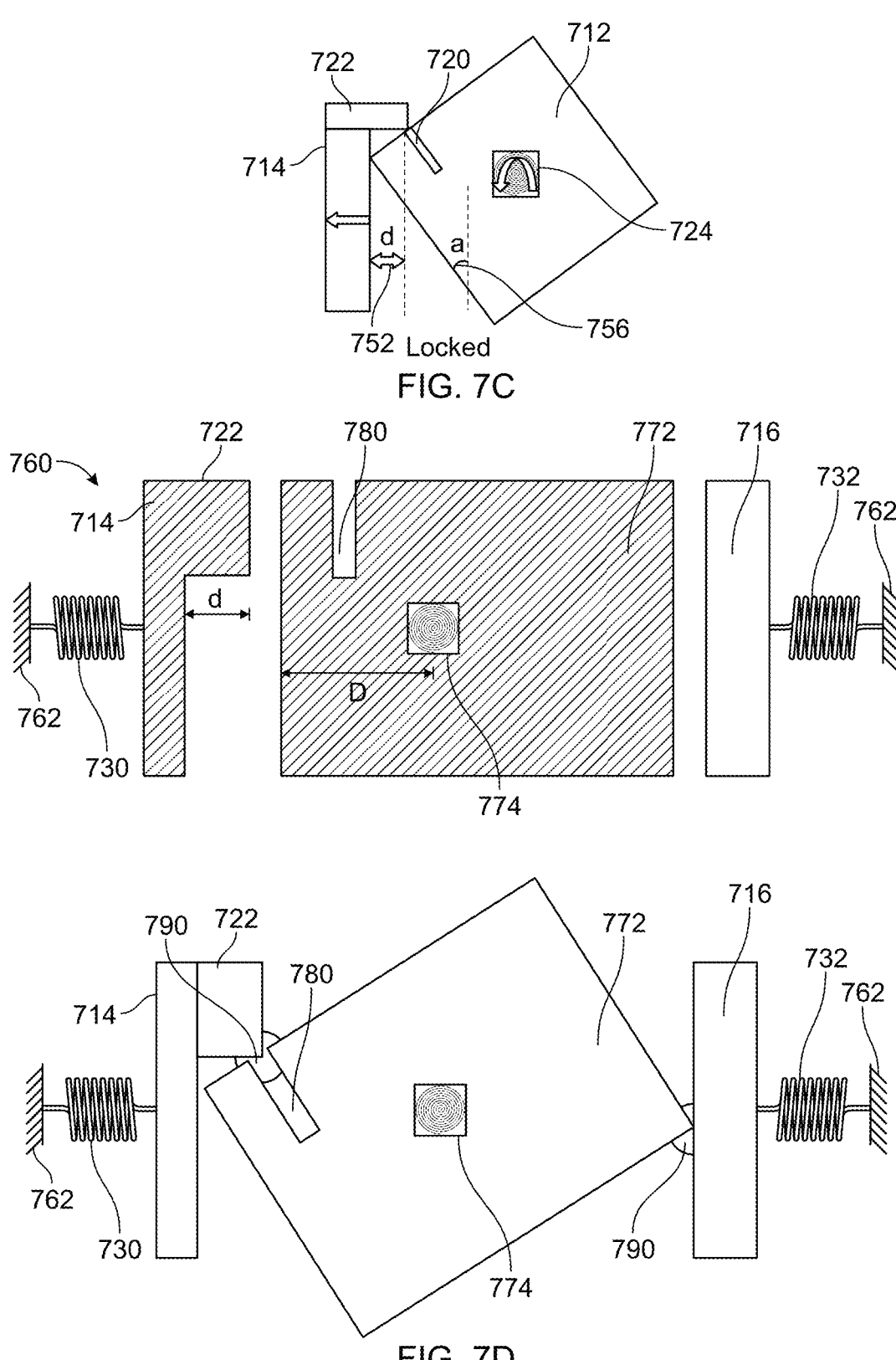
FIG. 7C shows critical dimensions when the example moveable structure in FIG. 7A is in a deployed position.
FIG. 7D is a variation of the moveable structure in FIG. 7A that is designed to be deployed at a different predetermined angle.

FIG. 7A shows two side mechanical diagrams of an example arrangement 700 of a moveable structure that is designed to be deployed at a predetermined angle to the horizontal plane of the substrate and the vertical plane. FIG. 7B shows the relevant dimensions of the moveable structure and anchor structure in FIG. 7A to determine a deployment angle. FIG. 7C shows the relevant dimensions of the moveable structure and anchor structure in FIG. 7A for the predetermined offset angle at the deployed position. FIG. 7D shows side mechanical diagrams of a variation of the moveable structure in FIG. 7A that is designed to be deployed at a different predetermined offset angle.

FIG. 7A shows the arrangement 700 on a MEMs substrate 710 that includes a moveable device structure 712 and anchor structures 714 and 716 in an initial position and in a deployed position. The moveable device structure 712 includes a slot 720 that locks in a tab 722 of the anchor structure 714. The moveable device structure 712 is supported by a torsional member 724 that allows rotation of the moveable device structure 712. The anchor structure 714 is attached to the substrate 710 via spring flexure members represented by a spring 730. The anchor structure 716 is attached to the substrate 710 via spring flexure members represented by a spring 732. In this example, the dimensions of the anchor structures 714 and 716 are selected for a specific deployment angle of 30.7 degrees of the moveable device structure 712 relative to the vertical plane.

Thus, when the moveable device structure 712 in the deployed position it is rotated around the torsional members 724. When the moveable structure 712 is rotated, edges of structure 712 contact the respective anchor structures 714 and 716. The contact pushes the anchor structure 714 toward the substrate 710 and compresses the spring 730. In the deployed position, the moveable structure 712 has been locked into place by the edge tab 722 of the anchor structure 714 being inserted in the slot 720. An adhesive 734 is applied between the tab 722 and the slot 720 and the opposite edge of the moveable device structure 712 and the anchor structure 716.

FIG. 7B shows example dimensions that may be determined for the moveable device structure 712 and the anchor structure 716 in order to position the moveable device structure 712 at the predetermined offset angle a (shown in FIG. 7C). In this example, the relevant dimensions of the moveable device structure 712 includes the height (h) represented by an arrow 740; the distance between the torsion spring member 724 and the edge of the structure 712 (D) represented by an arrow 742; the distance between the edge of the structure 712 and the slot 720 (w) represented by an arrow 744; the radius between the torsion spring 724 and the location of the slot 720 (R) represented by an arrow 746; and the angle of the radius between the torsion spring 724 and the location of the slot 720 (b) represented by a line 748. In this example, the relevant dimensions of the anchor structure 714 include the thickness of the tab 722 (t) shown as an arrow 750; the length of the tab 722 that extends from the edge of the anchor structure 714 (d) shown as an arrow 752; and the distance between the tab 722 and the edge of the moveable structure 712 (go) shown as an arrow 754.

FIG. 7C shows the deployment of the moveable structure 712 at a deployment angle (a) relative to the vertical plane as shown as a line 756. The determination of the predetermined angle (a) of the deployed position of the moveable structure 712 is thus:

$$R[\sin(b) - \sin(b - a)] = t$$

$$R\cos(b) = D - w$$

$$R\sin(b) = h/2$$

In this example, the amount of lateral compression in the anchor structure 714 against the spring member 730 in FIG. 7A may be determined as:

$$R[\cos(b - a) - \cos(b)] - (w + g_0) \geq 0$$

Another boundary condition is that the undercut, d, in the anchor structure 714 needs to be large enough so that the vertical surface of the anchor structure will not interfere with the motion of the moveable structure 712 preventing it from reaching the locked position. The boundary condition for the undercut is thus expressed as:

$$d \geq w \cos(\alpha)$$

As explained above, d represents the designed extension of the tab 722 in the moveable anchor structure 714.

One example of dimensions for a predetermined angle of 30.7 degrees to the vertical plane and therefore a predetermined offset angle of 59.3 degrees to the horizontal plane of the substrate 710 may be is follows. h may be 200 μm, D may be 150 μm, w may be 5 μm, $g_0$ is 3 μm, d is 6 μm and t is 10 μm. With these dimensions, the R dimension may be determined and thus the relevant angles a and b may be determined as follows:

$$R = \sqrt{(h/2)^2 + (D-w)^2} \sim 176 \text{ um}$$

$$b = \sin^{-1}(h/2R) \sim 34.6 \text{ deg}$$

$$a = \sin^{-1}[\sin(b) - t/R] \sim 30.7 \text{ deg}$$

$$R[\cos(b-a) - \cos(b)] - (w+g_0) = 22.7 \text{ um} > 0$$

The lateral compression allowed by the anchor structure 714 is thus 22.7 μm.

$$d = 6 \text{ um} > w\cos(a) = 4.3 \text{ um}$$

The boundary condition of the overhang length, d, is also sufficient as it is 6 μm, which is greater than 4.3 μm. The dimensions may thus be determined to produce the desired offset angle.

FIG. 7D shows another arrangement 760 on a MEMs substrate 762 that includes a different moveable device structure 772 and the same anchor structures 714 and 716 in an initial position and in a deployed position. The moveable device structure 772 is rotatable around a torsional member 774 and includes a slot 780 that locks in the tab 722 of the anchor structure 714. The moveable device structure 772 is located between the anchor structures 714 and 716. The anchor structures are supported by flexures represented by springs 730 and 732. In this example, the dimensions of the moveable device structure 772 are selected for a specific deployment angle of 19.9 degrees relative to the vertical plane or 70.1 degrees relative to the horizontal plane of the substrate. In this example, identical dimensions of the moveable device structure 772 to the moveable device structure 712 include h of 200 μm, w of 5 μm, $g_0$ of 3 μm, and t of 10 μm. However, the distance between the torsion spring 774 and the edge of the structure 772, D is changed from 150 μm to 250 μm to allow for the angle of 19.9 degrees. Thus, the moveable structure 772 has different dimensions than that of the moveable structure 712 in FIG. 7A. The determination of the angle from the dimensions of the moveable structure 772 and the anchor structure 714 is as follows:

$$R = \sqrt{(h/2)^2 + (D-w)^2} \sim 265 \text{ um}$$

$$b = \sin^{-1}(h/2R) \sim 22.2 \text{ deg}$$

$$a = \sin^{-1}[\sin(b) - t/R] \sim 19.9 \text{ deg}$$

$$R[\cos(b-a) - \cos(b)] - (w+g_0) = 11.4 \text{ um} > 0$$

In this example, the lateral compression allowed by the anchor structure 714 is thus 11.4 μm.

$$d = 6 \text{ μm} > w\cos(a) = 4.7 \text{ μm}$$

The boundary condition of the overhang length, d, is also sufficient as it is 6 μm, which is greater than 4.7 μm.

Thus, when the moveable device structure 772 in the deployed position it is rotated around the torsional member 774. When the moveable structure 772 is rotated, the edge contacts the anchor structures 714 and 716. The contact pushes the anchor structure 714 toward the substrate 710 and compresses the spring 730. In the deployed position, the moveable structure 772 has been locked into place by the edge tab 722 of the anchor structure 714 being inserted in the slot 780. The dimensions of the moveable device structure 772 and the anchor structure 714 are selected to allow the anchor structure 764 to hold the moveable device structure 712 at the desired angle of 19.9 degrees to the vertical plane. An adhesive 790 is applied between the tab 722 and the slot 780 and the contact point between the anchor structure 714 and the moveable device structure 772.

Figure 8A:
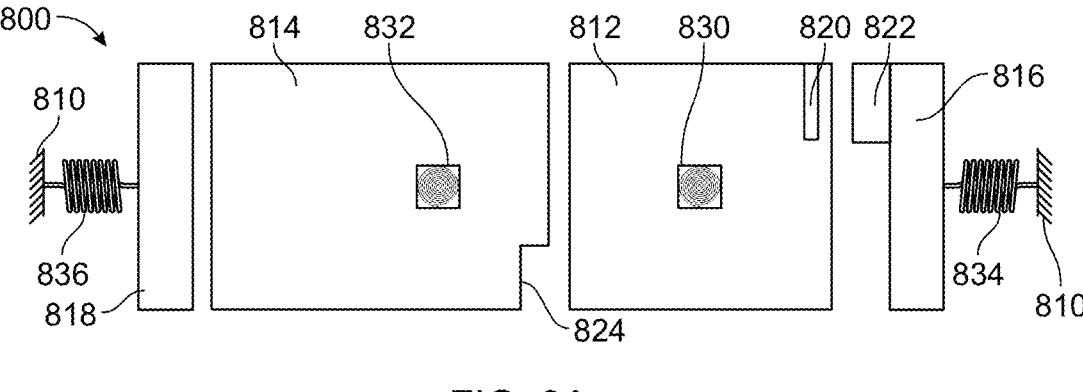
FIG. 8A is a side view mechanical diagram of an example two moveable structure two anchor arrangement in an initial position.

FIG. 8A shows a side view mechanical diagram of another arrangement 800 on a MEMs substrate 810 that includes two moveable device structures 812 and 814 and two anchor structures 816 and 818. The moveable devices structures 812 and 814 are fabricated between the anchor structures 816 and 818. The first moveable device structure 812 includes a slot 820 that locks in a tab 822 of the first anchor structure 816. In this example, one edge of the second moveable structure 814 includes a cutout 824 that is designed to position the second structure 814 at an angle relative the first structure 812 in the deployment position. The first moveable device structure 812 is supported by a torsional member 830 that allows rotation of the moveable device structure 812. The second moveable device structure 814 is supported by a torsional member 832 that allows rotation of the second moveable device structure 814. The first anchor structure 816 is attached to the substrate 810 via spring flexure members represented by a spring 834. The second anchor structure 818 is supported on the substrate 810 via spring flexure members represented by a spring 836.

Figure 8B:
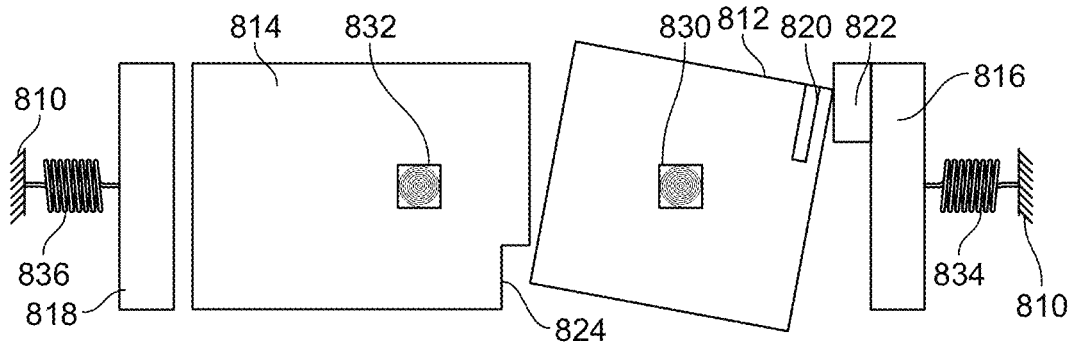
FIG. 8B is a side view mechanical diagram of an example two moveable structure two anchor arrangement being moved from the initial position.

FIG. 8B shows a first deployment step where the first moveable device structure 812 is rotated around the torsional member 830 in a clockwise direction. As the first moveable device structure 812 is rotated, one corner contacts the tab 822 of the first anchor structure 816. The contact pushes the first anchor structure 816 and compresses the spring 834. An opposite corner of the first moveable device structure 812 contacts the cutout 824 of the second moveable device structure 814. The contact causes the second moveable device structure 814 to rotate around the torsional member 832 in a counter-clockwise direction. The rotation of the second moveable device structure 814 causes an edge of the moveable device structure to contact and move the second anchor structure 818 and compress the spring 836.

Figure 8C:
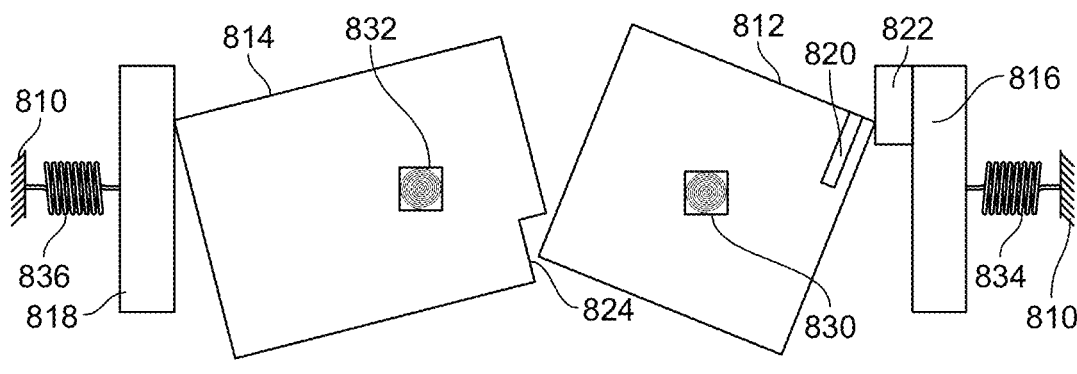
FIG. 8C is a side view mechanical diagram of an example two moveable structure two anchor arrangement moved to a deployed position.

FIG. 8C shows the moveable device structures 812 and 814 moved into the deployed position. When the moveable structure 812 is rotated further, the tab 822 of the anchor structure 816 is locked into the slot 820. The corner of the moveable structure 812 locks into the cutout 824 to hold the second moveable structure 814 at the predetermined angle. Once the moveable device structures 812 and 814 are at the deployed angles, adhesives are applied to join the moveable structures 812 and 814 to the anchor structures 816 and 818.

Figure 8D:
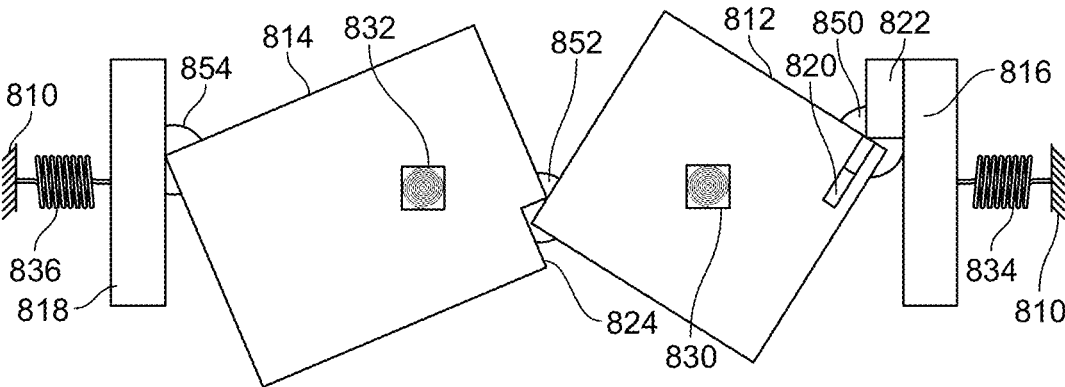
FIG. 8D is a side view mechanical diagram of an example two moveable structure two anchor arrangement in a deployed position.

FIG. 8D shows the final deployed position of the moveable device structures 812 and 814. The moveable device structures 812 and 814 are locked into predetermined angles relative to each other and the anchor structures 816 and 818. Contacts between the moveable device structures 812 and 814 and the anchor structures 816 and 818 hold the moveable device structures 812 and 814 in place. An adhesive 850 is applied at the intersection of the tab 822 of the anchor structure 816 and the slot 820 of the first moveable device structure 812. An adhesive 852 is applied where the corner of the moveable device structure 812 contacts the cutout 824 of the second moveable device structure 814. An adhesive 854 is applied on the corner of the second device structure 814 that contacts the second anchor structure 818.

Figure 9:
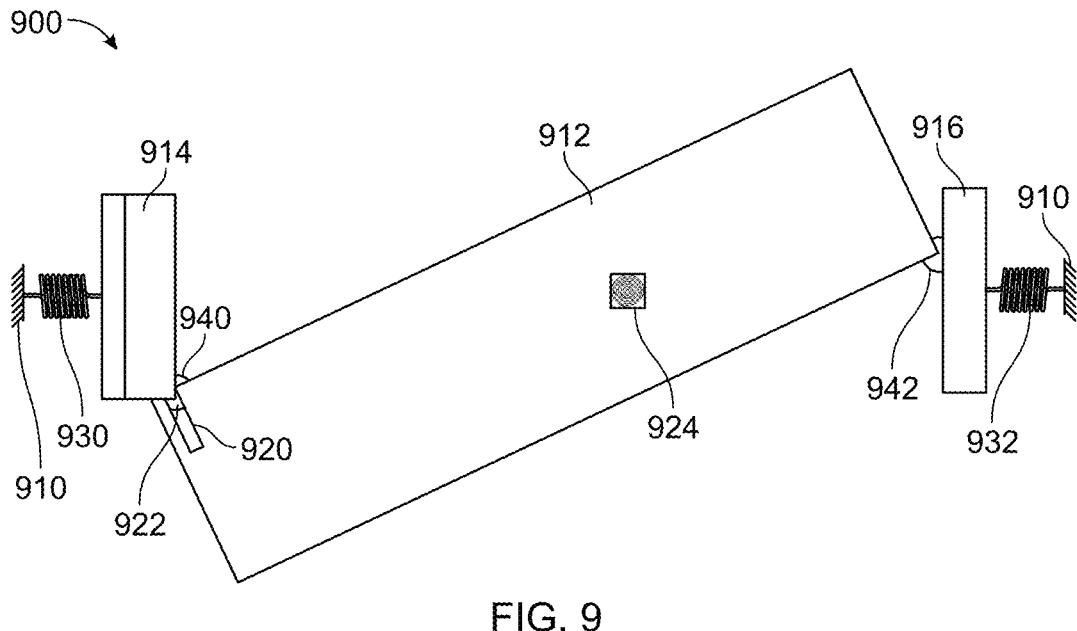
FIG. 9 is a side mechanical view of another anchoring arrangement for a moveable structure for a MEMS device.

FIG. 9 shows a side view mechanical diagram of another arrangement 900 that includes a MEMs substrate 910 that supports a moveable device structure 912 and two anchor structures 914 and 916. The moveable device structure 912 is in a deployed position and thus is locked against the anchor structures 914 and 916 at a predetermined angle. The moveable device structure 912 includes a slot 920 that locks in a bottom edge 922 of the first anchor structure 914 when the moveable device structure 912 is rotated. The moveable device structure 912 is supported by a torsional member 924 that allows rotation of the moveable device structure 912. The first anchor structure 914 is attached to the substrate 910 via spring flexure members represented by a spring 930. The second anchor structure 916 is supported on the substrate 910 via spring flexure members represented by a spring 932.

The moveable device structure 912 is rotated around the torsional member 924 in a counter-clockwise direction. As the first moveable device structure 912 is rotated, the device structure 912 contacts the first anchor structure 914 and pushes the first anchor structure 914 and compresses the spring 930. An opposite corner of the moveable device structure 912 contacts the second anchor structure 916 and compress the spring 932. The moveable device structure 912 may be rotated until the edge 922 of the first anchor structure 914 locks into the slot 920. The anchor structures 914 and 916 hold the moveable device structure 912 at the predetermined angle. An adhesive 940 is applied to the contact point between the edge 922 and the slot 920. Another adhesive 942 is applied to the contact point between the moveable device structure 912 and the second anchor structure 916.

FIG. 10A shows another arrangement 1000 with a substrate 1010 that supports two moveable device structures 1012 and 1014 and a center anchor structure 1016. FIG. 11 shows a perspective view of the arrangement 1000 fabricated on the substrate 1010. The moveable device structures 1012 and 1014 and the center anchor structure 1016 from an actuator assembly with torsional springs between each of the structures 1012, 1014, and 1016. Two side anchor clamp structures 1018 and 1020 are supported from the substrate 1010. The moveable device structures 1012 and 1014 have respective slots 1022 and 1024. The moveable device structures 1012 and 1014 are rotated around respective torsional springs 1030 and 1032. The center anchor structure 1016 is separated by torsional springs 1034 and 1036 from the respective moveable structures 1012 and 1014.

The side anchor clamp structures 1018 and 1020 move laterally with respect to the substrate 1010. Thus, the side anchor clamp structures 1018 and 1020 are supported by flexures that are represented by respective springs 1040 and 1042. Each of the clamp structures 1018 and 1020 have respective tabs 1044 and 1046 that lock the respective slots 1022 and 1024 of the moveable structures 1012 and 1014.

As shown in FIG. 10B, to actuate the setup, downward forces are applied to the moveable device structures 1012 and 1014 of the actuator assembly through a device such as a pick and place machine. As shown in FIG. 11, each of the moveable device structures 1012 and 1014 have respective contact pads 1112 and 1114 that serve as contacts for pick and place machine to apply force. Since the end moveable device structures 1012 and 1014 are anchored with torsional springs 1030 and 1032, they will rotate accordingly. The center stage 1016 is supported by the two torsional springs 1034 and 1036. These springs 1034 and 1036 also twist, moving the anchor stage 1016 upward. As the actuation continues, the end moveable device structures 1012 and 1014 make contact with the respective anchor clamps 1018 and 1020 and start to push anchor clamps 1018 and 1020 to the substrate.

The moveable device structures 1012 and 1014 may thus be rotated on the torsion members 1030 and 1032 from an initial position to a specific predetermined angle in a deployed position as shown in FIG. 10C. In the deployed position in FIG. 10C, the motion of the moveable structures 1012 and 1014 eventually stops when the pre-fabricated slots 1022 and 1024 are aligned with the tabs 1044 and 1046 of the anchor clamp structures 1018 and 1020. This fixes the structures 1012, 1014 and 1016 of the entire actuator assembly. Additional adhesives 1050 and 1052 can be applied to the contact points of the tabs 1044 and 1046 and the slots 1022 and 1024 to help strengthen the final configuration.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

As used in this application, the terms "component," "module," "system," or the like, generally refer to a computer-related entity, either hardware (e.g., a circuit), a combination of hardware and software, software, or an entity related to an operational machine with one or more specific functionalities. For example, a component may be, but is not limited to being, a process running on a processor (e.g., digital signal processor), a processor, an object, an executable, a thread of execution, a program, and/or a computer. By way of illustration, both an application running on a controller, as well as the controller, can be a component. One or more components may reside within a process and/or thread of execution, and a component may be localized on one computer and/or distributed between two or more computers. Further, a "device" can come in the form of specially designed hardware, generalized hardware made specialized by the execution of software thereon that enables the hardware to perform specific function, software stored on a computer-readable medium, or a combination thereof.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present invention have been described above, it should be understood that they have been presented by way of example only, and not limitation. Although the invention has been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application. Thus, the breadth and scope of the present invention should not be limited by any of the above described embodiments. Rather, the scope of the invention should be defined in accordance with the following claims and their equivalents.

What is claimed is:

1. A micro-electromechanical system (MEMS) comprising:
   a substrate;
   a moveable device structure supported on the substrate, the device structure including a slot and the device structure moveable from an initial position to a deployment position at a predetermined offset angle to the substrate; and
   a moveable anchor structure having a side facing the device structure with an extended tab, the moveable anchor structure supported on the substrate in proximity to the device structure, wherein the moveable anchor structure is separated from the moveable device structure in the initial position, and wherein when the moveable device structure is moved to the deployment position, the moveable device structure contacts the moveable anchor structure and the extended tab of the anchor structure is locked to the slot of the device structure when the device structure is moved to the deployment position.

2. The MEMS of claim 1, further comprising an adhesive joining the device structure to the anchor structure in the locked position.

3. The MEMS of claim 1, further comprising a first spring member coupled to the moveable anchor structure, the anchor structure deforming the first spring member from the movement of the device structure.

4. The MEMS of claim 1, wherein the predetermined offset angle is determined by a dimension of the device structure.

5. The MEMs of claim 3, further comprising a second anchor structure supported on the substrate, the second anchor structure including an extended tab, the second anchor structure coupled to a second spring member and is separated from the device structure in the initial position, wherein the device structure contacts the second anchor structure and where the extended tab of the second anchor structure is locked to a second slot in the device structure, when the device structure is moved in the deployment position.

6. The MEMs of claim 1, further comprising a torsional bar coupling the device structure to the substrate.

7. The MEMS of claim 1 further comprising a bending beam coupling the device structure to the substrate.

8. The MEMS of claim 1 wherein the device structure includes a mirror.

9. The MEMS of claim 3, wherein the predetermined offset angle is based on force balances between predetermined translational and rotational stiffnesses of the first spring member.

10. The MEMS of claim 1, wherein a one-dimensional actuator is used to position the first moveable structure into the deployment position.

11. The MEMS of claim 1, wherein the moveable device structure is part of a light detection and ranging (LiDAR) beam steering apparatus.

12. The MEMs of claim 1, wherein the moveable device structure includes an actuation pad overlapping a cutout in the anchor structure, wherein force applied to the actuation pad causes the moveable device structure to move to the deployed position.

13. The MEMs of claim 1, wherein the moveable device structure is fabricated from at least one of crystalline, polycrystalline or metal materials.

14. A method of fixing a moveable structure at a predetermined angle in a micro-electromechanical system (MEMS), the method comprising:
   forming a moveable device structure torsionally supported on a substrate in an initial position, wherein a slot is formed in the moveable device;
   forming a moveable anchor structure having a side facing the device structure with an extended tab, the moveable anchor structure supported by the substrate in proximity to the device structure, wherein the moveable anchor structure is separated from the device structure in the initial position;
   moving the device structure from an initial position to a deployment position at a predetermined offset angle to the substrate to contact the moveable anchor structure; and
   locking the extended tab of the anchor structure to the slot of the device structure when the device structure is moved to the deployment position.

15. The method of claim 14, further comprising applying an adhesive where the device structure is joined to the anchor structure in the locked position.

16. The method of claim 14, wherein a first spring member is coupled to the moveable anchor structure, and wherein the anchor structure deforms the first spring member from the movement of the device structure.

17. The method of claim 14, wherein a one-dimensional actuator is used to position the first moveable structure into the deployment position.

18. The method of claim 14, wherein the moveable device structure includes an actuation pad overlapping a cutout in the anchor structure, wherein force applied to the actuation pad causes the moveable device structure to move to the deployed position.

* * * * *